United States Patent
Yoshinaga et al.

(10) Patent No.: US 8,112,853 B2
(45) Date of Patent: Feb. 14, 2012

(54) METHOD OF MANUFACTURING CAPACITOR-INTEGRATED BUSBAR

(75) Inventors: Fumitaka Yoshinaga, Toyota (JP); Naoyoshi Takamatsu, Susono (JP)

(73) Assignee: Toyota Jidosha Kabushiki Kaisha, Aichi-Ken (JP)

( * ) Notice: Subject to any disclaimer, the term of this patent is extended or adjusted under 35 U.S.C. 154(b) by 85 days.

(21) Appl. No.: 12/594,898

(22) PCT Filed: May 20, 2008

(86) PCT No.: PCT/JP2008/059617
§ 371 (c)(1),
(2), (4) Date: Oct. 6, 2009

(87) PCT Pub. No.: WO2008/146770
PCT Pub. Date: Dec. 4, 2008

(65) Prior Publication Data
US 2010/0132193 A1    Jun. 3, 2010

(30) Foreign Application Priority Data
May 25, 2007    (JP) .................. 2007-139009

(51) Int. Cl.
*H01G 7/00* (2006.01)
(52) U.S. Cl. ................ 29/25.42; 29/592.1; 361/306.1

(58) Field of Classification Search ............ 29/830–831, 29/846–847, 852, 25.41–25.42, 592.1, 594, 29/25.01–25.03; 361/306.1–306.4, 520, 361/538; 264/219
See application file for complete search history.

(56) References Cited

U.S. PATENT DOCUMENTS

| | | | | |
|---|---|---|---|---|
| 4,236,038 A | * | 11/1980 | Taylor | 174/72 B |
| 4,429,344 A | * | 1/1984 | Whitman et al. | 361/303 |
| 4,584,768 A | * | 4/1986 | Tosti | 29/872 |
| 4,785,523 A | * | 11/1988 | Koseki et al. | 29/530 |
| 5,253,148 A | * | 10/1993 | Katsu | 361/539 |
| 5,269,977 A | * | 12/1993 | Nakahashi et al. | 264/1.9 |
| 5,357,399 A | * | 10/1994 | Salisbury | 361/529 |
| 6,215,649 B1 | | 4/2001 | Appelt et al. | |
| 6,836,401 B2 | * | 12/2004 | Yoshida et al. | 361/538 |
| 7,508,652 B2 | * | 3/2009 | Kobayashi | 361/523 |
| 2006/0133057 A1 | | 6/2006 | McGregor et al. | |
| 2010/0132193 A1 | * | 6/2010 | Yoshinaga et al. | 29/874 |

FOREIGN PATENT DOCUMENTS

| | | |
|---|---|---|
| JP | 10-098887 A | 4/1998 |
| JP | 2003-319665 A | 11/2003 |
| JP | 2004-312925 A | 11/2004 |
| JP | 2005-020953 A | 1/2005 |
| JP | 2005-192296 A | 7/2005 |
| JP | 2005-347561 A | 12/2005 |
| JP | 2006-179924 A | 7/2006 |
| JP | 2007-209141 A | 8/2007 |

* cited by examiner

*Primary Examiner* — Minh Trinh
(74) *Attorney, Agent, or Firm* — Sughrue Mion, PLLC

(57) ABSTRACT

A method of manufacturing a capacitor-integrated busbar includes disposing a pair of metal conductors having surfaces facing each other with a gap lying therebetween, injecting a resin material in a fluid state into the gap between the metal conductors disposed to face each other, and forming a plate-like resin by hardening the injected resin material.

3 Claims, 6 Drawing Sheets

METHOD OF MANUFACTURING CAPACITOR-INTEGRATED BUSBAR

TECHNICAL FIELD

The present invention relates to a method of manufacturing a capacitor-integrated busbar and a power conversion device.

BACKGROUND ART

Hybrid electric vehicles and the like are equipped with an electric drive system in addition to a conventional engine. This electric drive system includes a battery which is a DC power supply, an inverter device which is a power conversion device, and an AC motor which is a motor. In a vehicle including this electric drive system, DC power supplied from the battery is converted to AC power by the inverter device, and this AC power is used to drive the AC motor, thereby obtaining driving power of the vehicle.

FIG. 14 is a circuit configuration diagram of a common electric drive system mounted on a vehicle. As described above, the electric drive system includes a battery 1, an inverter device converting DC power obtained from battery 1 to AC power, and an AC motor 8 driven by the AC power output from the inverter device.

The inverter device includes a switching module 2 having switching elements 6, a switching control circuit (not shown) controlling switching elements 6, a smoothing capacitor 3 smoothing the DC power supplied to switching elements 6, and busbars 4, 5 electrically connecting switching module 2 and smoothing capacitor 3 to each other.

For switching element 6, an IGBT (Insulated Gate Bipolar Transistor), a power MOSFET (Metal Oxide Semiconductor-Field Effect Transistor) or the like is used. In addition, the switching control circuit causes ON/OFF operation of switching elements 6 by PWM (Pulse Width Modulation) control in response to a signal from a not-shown ECU (Electrical Control Unit), to operate the inverter device under optimum conditions in accordance with a running state of the vehicle.

Examples of switching module 2 include a switching module provided with the above switching control circuit outside a housing thereof, and a switching module called IPMs (Integrated Power Modules) where the switching control circuit is incorporated inside the housing. In recent years, the IPMs have become mainstream with growing demand for improved ease of assembly and smaller inverter devices.

As shown in FIG. 14, P and N terminals which are a positive electrode and a negative electrode of switching module 2 are electrically connected to a positive electrode and a negative electrode of battery 1, respectively. Further, between switching module 2 and battery 1, smoothing capacitor 3 for smoothing the DC power supplied from battery 1 is connected in parallel.

For connecting lines that connect the P terminal and the N terminal of switching module 2 to a positive electrode and a negative electrode of smoothing capacitor 3, respectively, busbars 4, 5 which are plate-like bodies made from a conductive material are used. On the other hand, U, V, W terminals which are terminals on an output side of switching module 2 are electrically connected to respective input terminals of three-phase AC motor 8.

Smoothing capacitor 3 is required to have a very large capacity. For smoothing capacitor 3 used in hybrid electric vehicles in practical use, a capacitor having a capacity of several hundred μF to several thousand g has been used. Smoothing capacitor 3 is accordingly a very large capacitor, and is thus usually installed outside the housing of switching module 2.

In the above inverter device, switching of switching elements 6 is performed at high speed, for example, at 10 kHz. Because of this, line inductance of internal lines of switching module 2 and busbars 4, 5 are unignorable.

Stray inductance due to these connecting lines causes application of a large surge voltage to switching elements 6 during switching. Although no problem arises when switching element 6 has a withstand voltage set sufficiently high with respect to a power supply voltage, this surge voltage may break switching element 6 without sufficient margin.

In order to reduce the line inductance, therefore, it is necessary to dispose smoothing capacitor 3 and switching module 2 in proximity to each other, so that the connecting lines can be shortened and thus the line inductance is reduced. Further, the line inductance may also be reduced by disposing a to-line and a from-line of the connecting lines in proximity to each other. This is because by disposing the to-line and the from-line close to each other, mutual inductance reduces the line inductance.

This measure alone, however, cannot completely suppress generation of a surge voltage. There is thus an inverter device configured to have a separately provided circuit for protecting switching elements 6, which is called a snubber circuit, thereby absorbing a surge voltage generated inside the circuit to prevent the surge voltage from being applied to switching elements 6.

Japanese Patent Laying-Open No. 2003-319665 discloses an inverter device in which a snubber circuit is constituted of busbars.

FIG. 15 is a schematic perspective view showing the structure of the inverter device in Japanese Patent Laying-Open No. 2003-319665. As illustrated, smoothing capacitor 3 and switching module 2 are connected to each other by a pair of busbars 15, 16. Switching module 2 is contained in the housing.

Although not illustrated, the pair of busbars 15, 16 is further connected to battery 1. Further, smoothing capacitor 3 is disposed as being divided into three parts due to its very large capacity, and the capacitors are connected to switching module 2 in parallel.

The pair of busbars 15, 16 has, in a region where switching module 2 is connected to smoothing capacitor 3, a facing region where their main surfaces are disposed to face each other and to be in proximity to each other. This facing region is provided for reducing the line inductance discussed above. In this facing region, a high dielectric 9 is provided between the pair of busbars 15 and 16.

High dielectric 9 is interposed between the pair of busbars 15 and 16 to form a capacitor. This capacitor forms a snubber circuit.

By providing this snubber circuit, the surge voltage applied to switching elements 6 during switching operation is absorbed, thereby suppressing the breakdown of switching elements 6.

Moreover, Japanese Patent Laying-Open No. 2004-312925 discloses electric equipment in which a smoothing capacitor and an inverter circuit are provided inside a single housing.

Japanese Patent Laying-Open No. 2005-20953 discloses a resin-molded busbar.

DISCLOSURE OF THE INVENTION

Japanese Patent Laying-Open No. 2003-319665 discloses the structure in which high dielectric 9 is interposed between the pair of busbars 15 and 16, but fails to disclose specific steps for manufacturing the structure.

Further, the capacitor including high dielectric 9 and busbars 15, 16 is provided outside the housing of switching module 2, which results in an increased distance between switching elements 6 forming switching module 2 and the capacitor. There is a problem that the capacitor is required to have a sufficiently large capacity to obtain a sufficient effect of decreasing a surge voltage.

The present invention was made to solve the above-described problems, and an object thereof is to provide a method of manufacturing a capacitor-integrated busbar by which a capacitor having a high dielectric sandwiched between a pair of busbars can be easily manufactured, as well as to provide a power conversion device having the more effectively disposed capacitor-integrated busbar.

According to one aspect of the method of manufacturing a capacitor-integrated busbar based on the present invention, a method of manufacturing a capacitor-integrated busbar including a highly dielectric plate-like resin having a resin material as a base material, and a pair of metal conductors having a facing region where the metal conductors face each other, the facing region being joined to opposing surfaces of the plate-like resin includes the steps of forming the plate-like resin by molding the resin material in a shape of a plate, and providing the opposing surfaces thereof with fine projections and recesses, and forming the pair of metal conductors joined to the opposing surfaces of the plate-like resin, respectively, by performing a plating process on the opposing surfaces of the plate-like resin provided with the fine projections and recesses.

According to another aspect of the method of manufacturing a capacitor-integrated busbar based on the present invention, a method of manufacturing a capacitor-integrated busbar including a highly dielectric plate-like resin having a resin material as a base material, and a pair of metal conductors having a facing region where the metal conductors face each other, the facing region being joined to opposing surfaces of the plate-like resin includes the steps of disposing the pair of metal conductors having surfaces facing each other to face each other with a gap lying therebetween, injecting a resin material in a fluid state into the gap between the metal conductors disposed to face each other, and forming the plate-like resin by hardening the injected resin material.

According to another aspect of the method of manufacturing a capacitor-integrated busbar based on the present invention, a method of manufacturing a capacitor-integrated busbar including a highly dielectric plate-like resin having a resin material as a base material, and a pair of metal conductors having a facing region where the metal conductors face each other, the facing region being joined to opposing surfaces of the plate-like resin includes the steps of forming the plate-like resin by molding the resin material in a shape of a plate, disposing the metal conductors to be joined to the opposing surfaces of the plate-like resin, respectively, and heating the metal conductors to melt the opposing surfaces of the plate-like resin, to weld the surfaces of the plate-like resin to the metal conductors.

According to the power conversion device based on the present invention, a power conversion device includes a power conversion circuit including a switching element and converting DC power to AC power, a capacitor-integrated busbar including a highly dielectric plate-like resin having a resin material as a base material, and a pair of metal conductors having a facing region where the metal conductors face each other, the facing region being joined to opposing surfaces of the plate-like resin, the plate-like resin and the pair of metal conductors forming a capacitor, and a housing accommodating the power conversion circuit and the capacitor-integrated busbar. The power conversion circuit is supplied with power via the metal conductors.

According to the method of manufacturing the capacitor-integrated busbar of the present invention, a capacitor having a high dielectric sandwiched between a pair of busbars can be easily manufactured. Further, according to the power conversion device of the present invention, a power conversion device having a more effectively disposed capacitor-integrated busbar can be provided.

BEST MODES FOR CARRYING OUT THE INVENTION

Figure 1:
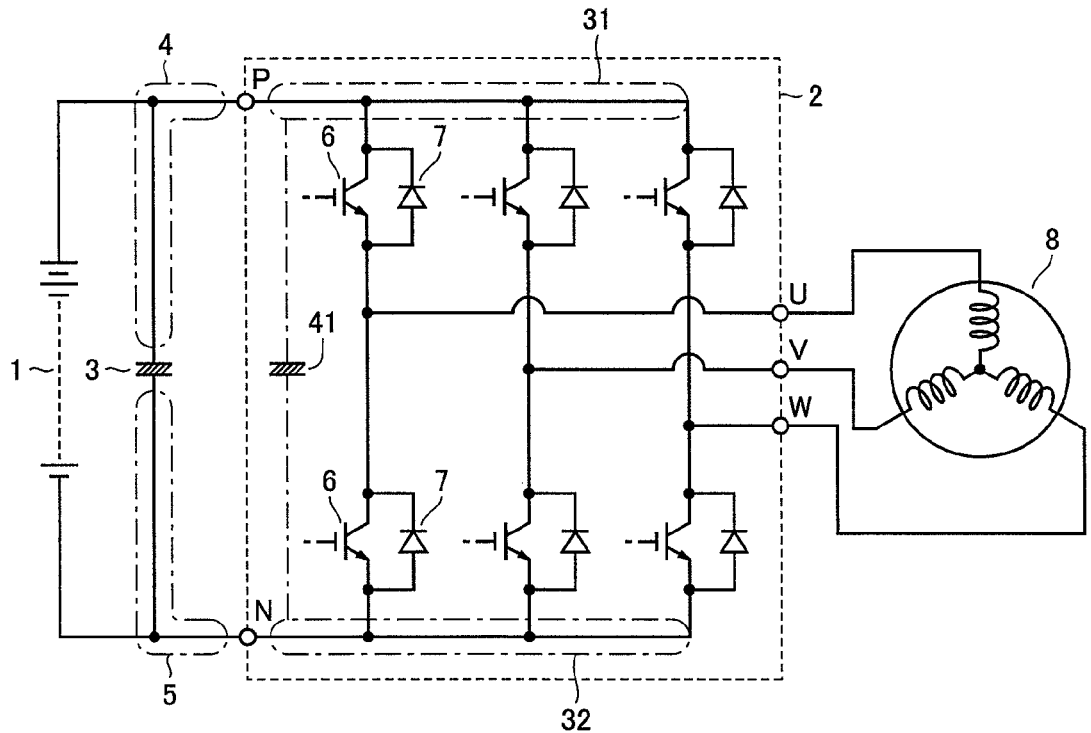
FIG. 1 is a circuit configuration diagram of an electric drive system in an embodiment based on the present invention.

A method of manufacturing a capacitor-integrated busbar and a power conversion device in each embodiment based on the present invention will be described hereinafter with reference to the drawings. In each embodiment, identical or corresponding parts are designated with the same reference numerals, and redundant descriptions will not be repeated.

FIG. 1 is a circuit configuration diagram of an electric drive system according to the present embodiment. The electric drive system shown in FIG. 1 includes a battery 1, an inverter device converting DC power obtained from battery 1 to AC power, and an AC motor 8 driven by the AC power output from the inverter device.

The inverter device includes a switching module 2 having switching elements 6, a switching control circuit (not shown) controlling switching elements 6, a smoothing capacitor 3 smoothing the DC power supplied to switching elements 6, and busbars 4, 5 electrically connecting switching module 2 and smoothing capacitor 3 to each other.

Provided inside a housing of switching module 2 are a busbar 31 interposed between a P terminal of switching module 2 and the plurality of switching elements 6, and a busbar 32 interposed between an N terminal of switching module 2 and the plurality of switching elements 6. There is a high dielectric disposed between busbar 31 and busbar 32, as will be described later, to form a capacitor 41.

For switching element 6, an IGBT (Insulated Gate Bipolar Transistor) or the like is used. In addition, the switching control circuit causes ON/OFF operation of switching elements 6 through PWM (Pulse Width Modulation) control in response to a signal from a not-shown ECU (Electrical Control Unit), to operate the inverter device under optimum conditions in accordance with a running state of the vehicle.

To form a current path during regenerative operation, a diode element 7 is provided in parallel to switching element 6.

Figure 2:
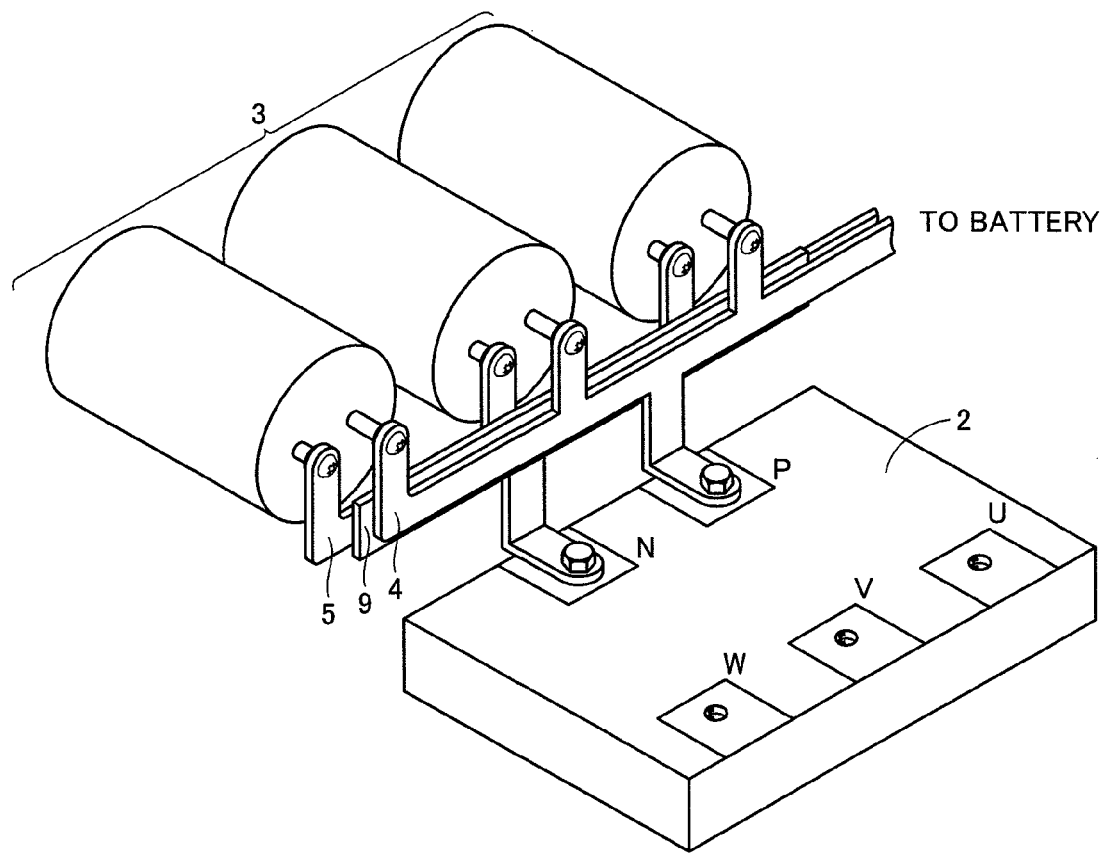
FIG. 2 is a perspective view showing a structure of an inverter device in the embodiment based on the present invention.

FIG. 2 is a perspective view showing a structure of the inverter device according to the present embodiment. As shown in FIG. 2, the P terminal which is a positive electrode of switching module 2 and the N terminal which is a negative electrode are electrically connected to a positive electrode and a negative electrode of battery 1, respectively.

Further, between switching module 2 and battery 1, smoothing capacitors 3 for smoothing the DC power supplied from battery 1 are connected in parallel.

For connecting lines that connect the P terminal and the N terminal of switching module 2 to a positive electrode and a negative electrode of smoothing capacitor 3, respectively, busbars 4, 5 which are plate-like bodies made from a conductive material are used. On the other hand, U, V, W terminals which are terminals on an output side of switching module 2 are electrically connected to respective input terminals of three-phase AC motor 8.

Usually, an electric drive system mounted on a vehicle is required to generate a very large driving force, and thus includes components adapted to large power having a large rated voltage and a large rated current. For this reason, smoothing capacitor 3 is also required to have a very large capacity.

For smoothing capacitor 3 used in hybrid vehicles in practical use, a capacitor having a capacity of several hundred μF to several thousand μF has been used. Smoothing capacitor 3 is accordingly a very large capacitor, and is thus installed outside the housing of switching module 2 in the present embodiment.

Figure 3:
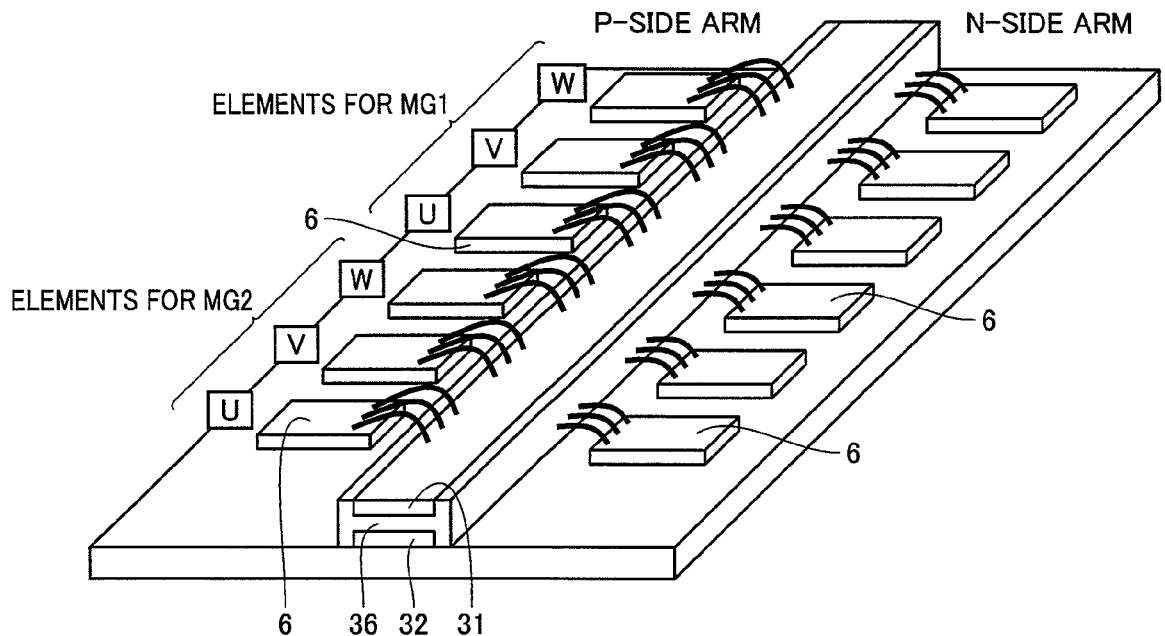
FIG. 3 is a perspective view showing an internal structure of a switching module in the embodiment based on the present invention.

FIG. 3 is a perspective view showing an internal structure of the switching module. FIGS. 1 and 2 show the switching module for driving a single motor 8. FIG. 3 shows switching module 2 for driving two motors MG1, MG2.

Each switching element is provided with a not-shown output terminal. Between the U terminal, the V terminal, the W terminal provided on an outer surface of switching module 2 (see FIG. 2) and the output terminals of the corresponding respective switching elements, not-shown busbars connecting these terminals to one another are provided.

As shown in FIG. 3, switching module 2 according to the present embodiment includes the plurality of switching elements 6, the not-shown diode elements, busbars 31, 32 forming capacitor 41 (see FIG. 1), and the like.

Busbars 31, 32 are disposed between three switching elements 6 on an N-side arm and three switching elements 6 on a P-side arm.

Busbars 31, 32 have a facing region where they face each other. Between busbars 31 and 32, a highly dielectric plate-like resin 36 having a resin material as a base material is provided to be joined to the facing region. Each switching element 6 is supplied with power from busbars 31, 32.

The pair of busbars 31, 32 has, in a region where the plurality of switching elements 6 are connected to the P terminal and the N terminal, the facing region where their main surfaces are disposed to face each other and to be in proximity to each other. The highly dielectric plate-like resin is provided to be joined to this facing region, to form capacitor 41.

Busbars 31, 32 are connected to switching elements 6 via wire bonding, leads and the like. In this case, switching elements 6 on the P-side arm located on the left side of FIG. 3 are connected to upper busbar 31, and switching elements 6 on the N-side arm located on the right side are connected to lower busbar 32.

In the structure shown in FIG. 3, to facilitate the connection via wire bonding between lower busbar 32 and switching elements 6 on the N-side arm, a side of busbar 32 on the N-side arm side may protrude from a side surface.

As a material for highly dielectric plate-like resin 36, a highly dielectric resin material mainly composed of a polyphenylene sulfide (PPS) resin, a polybutylene terephthalate (PBT) resin, an epoxy resin or the like, mixed with ceramic powders or the like to improve a dielectric constant may be used.

Further, the facing region of busbars 31, 32 may be provided with fine projections and recesses to increase the surface area, thereby increasing a capacitance of capacitor 41.

In the structure shown in FIG. 3, end portions of plate-like resin 36 wrap end surfaces of busbars 31, 32. That is, the end surfaces of busbars 31, 32 are covered with the protruding end portions of plate-like resin 36. This ensures a creepage distance between busbar 31 and busbar 32. Accordingly, isolation between busbar 31 and busbar 32 is ensured even when a gap therebetween is made smaller.

Capacitor 41 forms a snubber circuit. Consequently, a surge voltage applied to switching elements 6 during switching operation can be absorbed. Thus, breakdown of switching elements 6 can be prevented.

Moreover, capacitor 41 is provided inside the housing of switching module 2 that accommodates the plurality of switching elements 6, which leads to a reduced distance between switching elements 6 and capacitor 41. As a result, capacitor 41 can absorb the surge voltage more effectively. That is, the effect of absorbing a large surge voltage can be obtained even with a small capacity of capacitor 41.

Next, methods of manufacturing capacitor 41 constituted integrally with busbars 31, 32 will be described.

(Method 1 of Manufacturing Capacitor-Integrated Busbar)

With reference to FIGS. 4 to 8, a method of manufacturing the capacitor-integrated busbar according to the present embodiment will be described. First, a plate-like material 101 mainly composed of a polyphenylene sulfide (PPS) resin, a polybutylene terephthalate (PBT) resin, an epoxy resin or the like, mixed with ceramic powders or the like to improve a dielectric constant is prepared.

Figure 4:
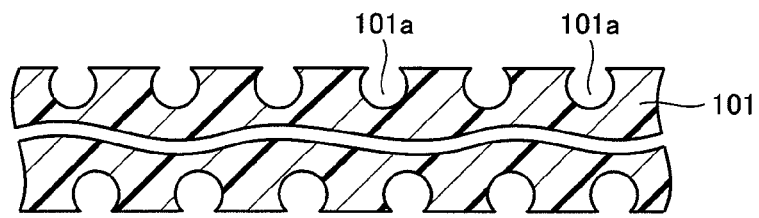
FIG. 4 is a process chart showing a method of manufacturing a capacitor-integrated busbar in the embodiment based on the present invention.

Referring to FIG. 4, surfaces of plate-like material 101 are roughened by chemical etching, to provide projections and recesses. At this time, it is preferable that a recess 101a has an inside diameter larger than a diameter thereof at the surface, as shown in FIG. 4.

Specifically, the surface of plate-like material 101 is chemically etched using chromic acid or the like, to roughen the surface of plate-like material 101, to thereby form the projections and recesses. The process with chromic acid leaves chromium compounds adhering to the surface of plate-like material 101. These chromium compounds are removed using hydrochloric acid or the like.

Figure 5:
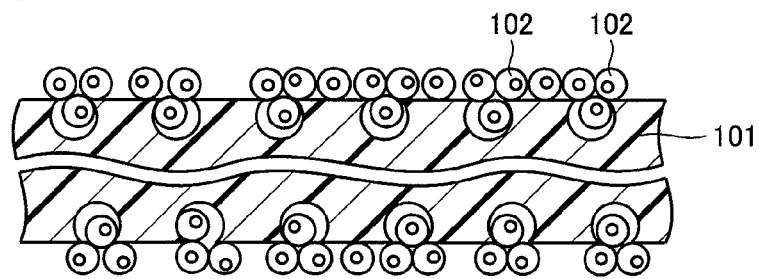
FIG. 5 is a process chart showing the method of manufacturing a capacitor-integrated busbar in the embodiment based on the present invention.

Referring to FIG. 5, a catalyst metal 102 is adsorbed to chemically etched plate-like material 101. This catalyst will become a core of electroless plating. For the catalyst metal, a Pd—Sn complex may be used, for example.

Figure 6:
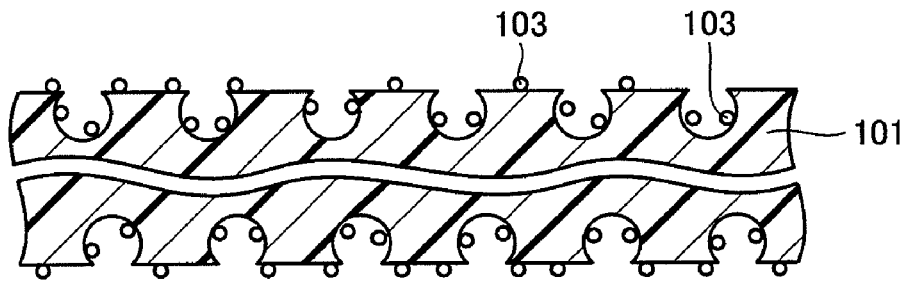
FIG. 6 is a process chart showing the method of manufacturing a capacitor-integrated busbar in the embodiment based on the present invention.

Referring to FIG. 6, a tin salt is dissolved, to generate metal palladium 103 by oxidation-reduction reaction.

Figure 7:
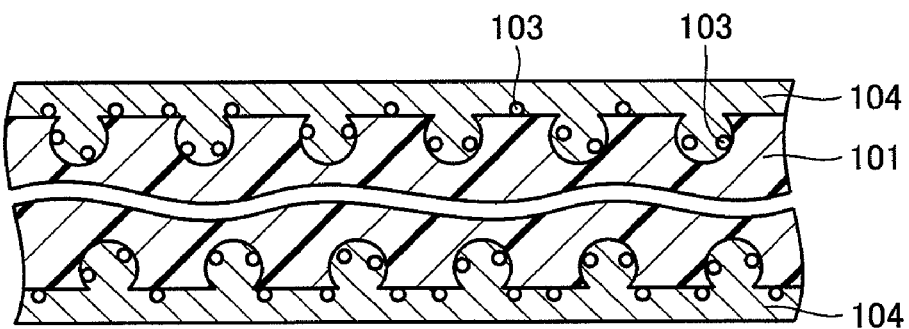
FIG. 7 is a process chart showing the method of manufacturing a capacitor-integrated busbar in the embodiment based on the present invention.

Referring to FIG. 7, a metal film is formed on the surface of plate-like material 101 by chemical plating. Specifically, plate-like material 101 with metal palladium 103 adhering thereto is immersed in a plating liquid. A reducing agent contained in the plating liquid is oxidized on a catalytically active palladium surface. Electrons emitted at this time reduce nickel ions, to form a plating coating 104 formed from a nickel coating on the surface of plate-like material 101 (see FIG. 8).

Figure 8:
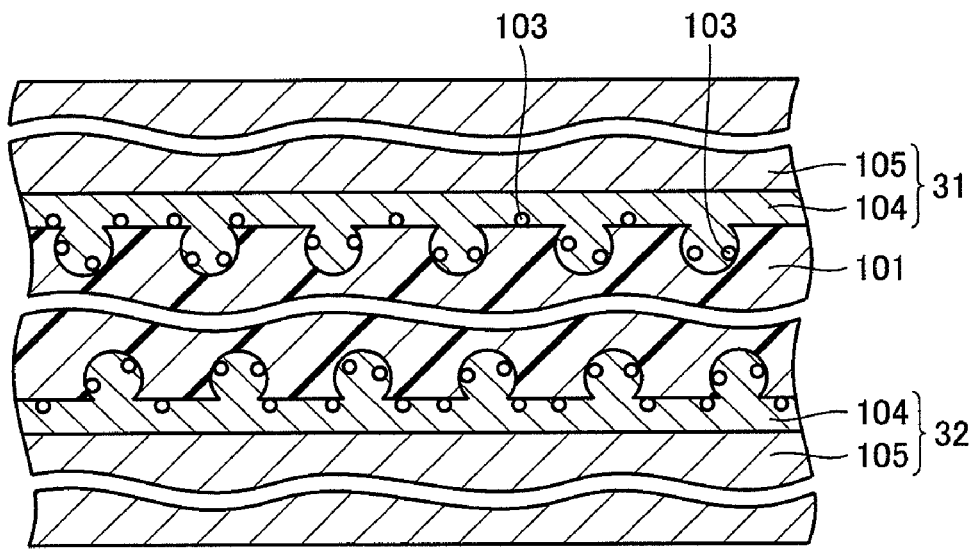
FIG. 8 is a process chart showing the method of manufacturing a capacitor-integrated busbar in the embodiment based on the present invention.

Referring to FIG. 8, plate-like material 101 with plating coating 104 formed thereon is electroplated, to further form an electroplating coating 105 on the plating coating. Specifically, as the provision of plating coating 104 allows electrical conduction, plate-like material 101 is immersed in a plating liquid to allow passage of a current with plating coating 104 as a negative electrode.

Metal ions in the plating liquid are separated on the surface of plating coating 104, to form electroplating coating 105. This step is continued for a prescribed period of time, to form busbars 31, 32 from plating coating 104 and electroplating coating 105.

According to the method of manufacturing the busbar of the present embodiment, busbars 31, 32 are formed by forming the metal films by plating on the surfaces of plate-like material 101, thereby tightly joining plate-like material 101 and busbars 31, 32 to one another. This can improve the characteristics of the capacitor including busbars 31, 32 and plate-like material 101.

Further, the projections and recesses provided on the surfaces of plate-like material 101 can increase the surface area of the facing surfaces of busbars 31, 32, which leads to an increased capacity of the capacitor.

Furthermore, by making recess 101a of plate-like material 101 to have a shape such that the inside diameter is larger than the diameter thereof at the surface, as illustrated, part of plating coating 104 enters the recess. This further ensures fixation between plating coating 104 and plate-like material 101.

(Method 2 of Manufacturing Capacitor-Integrated Busbar)

Next, with reference to FIGS. 9 to 11, a method of manufacturing the capacitor-integrated busbar according to the present embodiment will be described.

Figure 9:
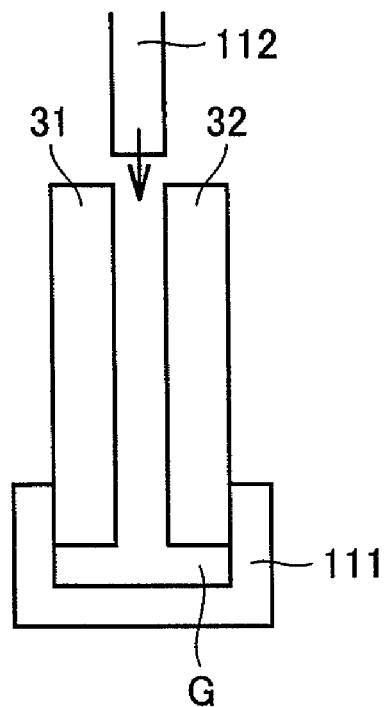
FIG. 9 is a process chart showing a method of manufacturing a capacitor-integrated busbar in the embodiment based on the present invention.

First, referring to FIG. 9, the pair of busbars 31, 32 is disposed to face each other at a prescribed distance from each other. Here, a mold 111 is provided around their outer peripheries to prevent outflow of a resin to be injected. A gap G is provided between the outer peripheries of busbars 31, 32 and the inner periphery of mold 111.

Figure 10:
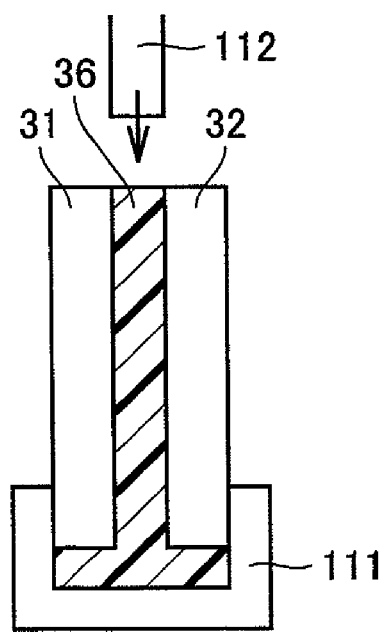
FIG. 10 is a process chart showing the method of manufacturing a capacitor-integrated busbar in the embodiment based on the present invention.

Referring to FIG. 10, the fluid resin is injected in between busbars 31 and 32 by a nozzle 112. At this time, the resin is ensured to spread into gap G, so that the resin is molded to have a shape that covers the outer peripheries of busbars 31, 32.

As the resin to be injected, a fluid resin mainly composed of a polyphenylene sulfide (PPS) resin, a polybutylene terephthalate (PBT) resin, an epoxy resin or the like, mixed with ceramic powders or the like to improve a dielectric constant may be used.

The injected resin is hardened, thereby forming plate-like resin 36 joined to busbars 31, 32.

Figure 11:
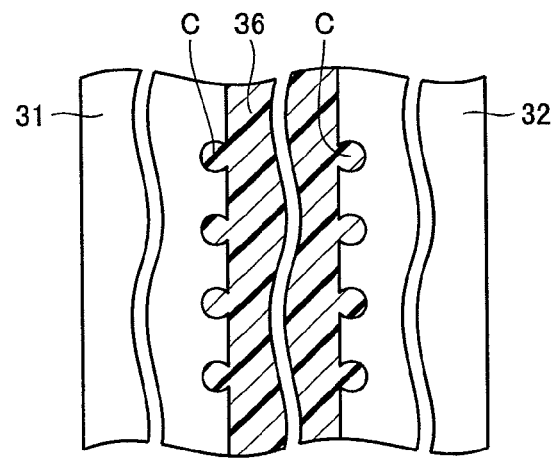
FIG. 11 is a process chart showing the method of manufacturing a capacitor-integrated busbar in the embodiment based on the present invention.

As shown in FIG. 11, busbars 31, 32 may be provided with recesses C in advance. Such recesses C may be formed in the following steps. A mask is formed on the surfaces of busbars 31, 32 other than portions where recesses C are to be formed. Busbars 31, 32 with the mask formed thereon are recessed by etching, to form recesses C.

The provision of recesses C in the facing region of busbars 31, 32 can increase the surface area of the facing region. This leads to an increased capacity of the capacitor, and further ensures fixation between busbars 31, 32 and the plate-like resin.

(Method 3 of Manufacturing Capacitor-Integrated Busbar)

Next, with reference to FIGS. 12 and 13, a method of manufacturing the capacitor-integrated busbar according to the present embodiment will be described.

Figure 12:
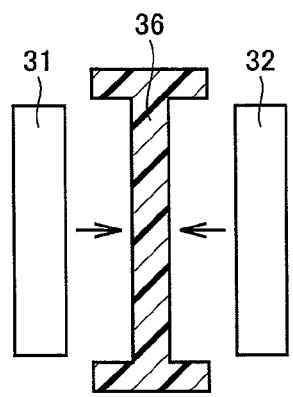
FIG. 12 is a process chart showing a method of manufacturing a capacitor-integrated busbar in the embodiment based on the present invention.

First, plate-like resin 36 having such a shape as shown in FIG. 12 is prepared in advance. Here, in order to form portions that will wrap the outer peripheries of busbars 31, 32, end portions of plate-like resin 36 protrude toward surface side.

As a material forming this plate-like resin 36, a thermoplastic resin such as a polybutylene terephthalate (PBT) resin or the like mixed with ceramic powders or the like to improve a dielectric constant may be used.

Referring to FIG. 12, busbars 31, 32 abut the surfaces of plate-like resin 36. That is, plate-like resin 36 is sandwiched between busbars 31 and 32.

Figure 13:
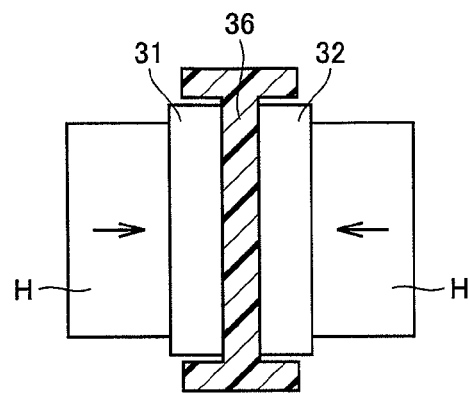
FIG. 13 is a process chart showing the method of manufacturing a capacitor-integrated busbar in the embodiment based on the present invention.
Figure 14:
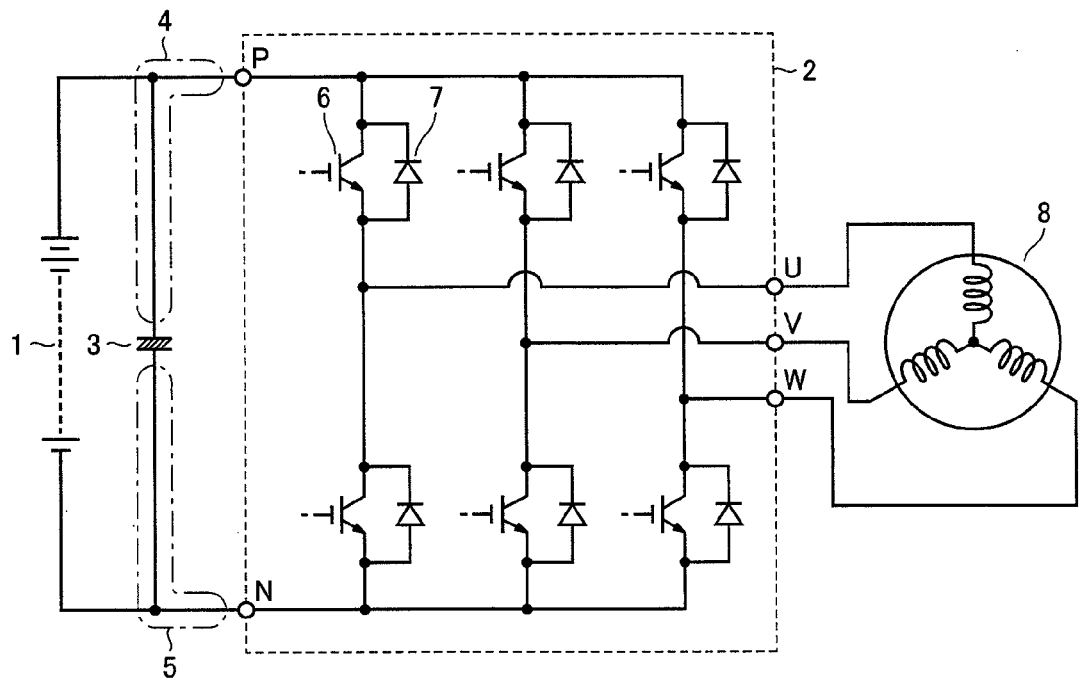
FIG. 14 is a circuit configuration diagram of a common electric drive system mounted on a vehicle.
Figure 15:
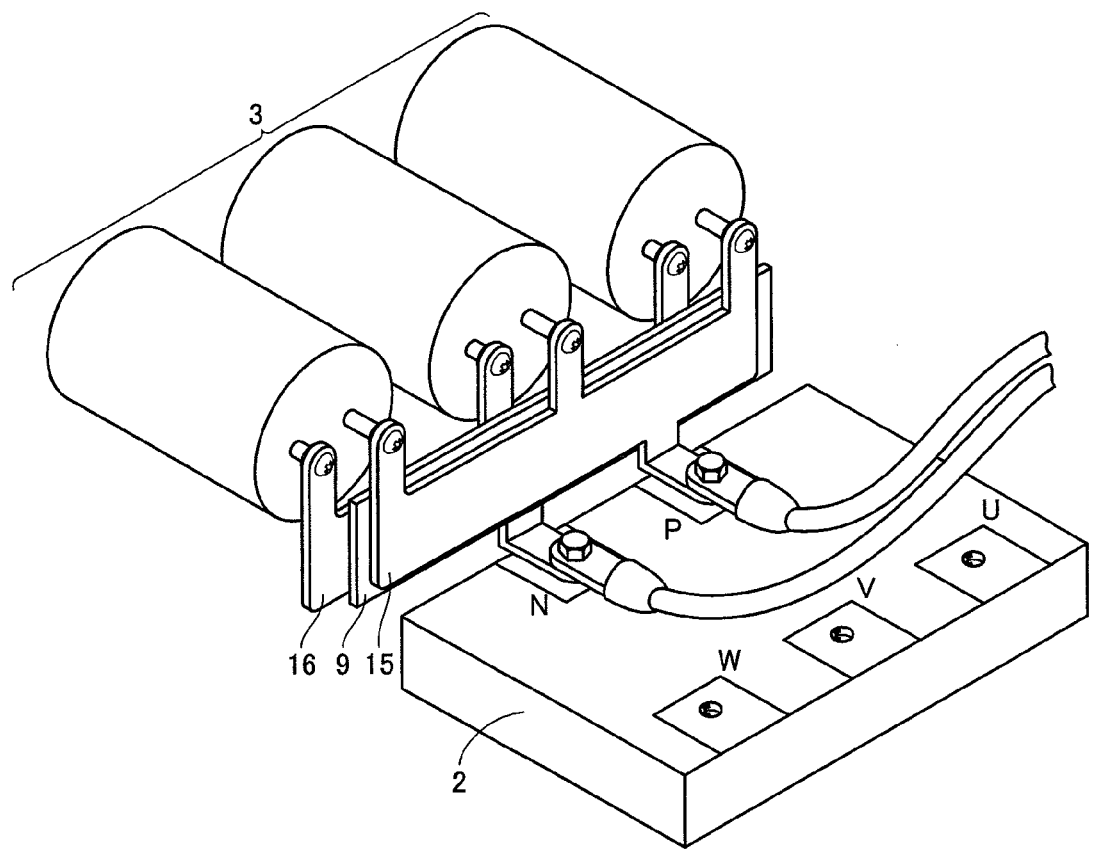
FIG. 15 is a schematic perspective view showing a structure of a conventional inverter device.

Next, referring to FIG. 13, heaters abut outer surfaces of busbars 31, 32, and busbars 31, 32 are heated while heaters are pressed against plate-like resin 36 appropriately. The surfaces of plate-like resin 36 thus melt and are joined to busbars 31, 32 with no gap lying therebetween. Busbars 31, 32 are cooled, thereby forming a capacitor-integrated busbar having busbars 31, 32 and plate-like resin 36 tightly joined to one another.

As in the above manufacturing methods, recesses may be provided in the facing region of busbars 31, 32 to increase the surface area of the facing region. This leads to an increased capacity of the capacitor, and further ensures fixation between busbars 31, 32 and the plate-like resin.

The above embodiments disclosed herein are illustrative and non-restrictive in every respect. The scope of the present invention is defined by the terms of the claims and not by the above description, and includes any modifications within the scope and meaning equivalent to the terms of the claims.

INDUSTRIAL APPLICABILITY

According to the method of manufacturing the capacitor-integrated busbar of the present invention, a capacitor having a high dielectric sandwiched between a pair of busbars can be easily manufactured. Further, according to the power conversion device of the present invention, a power conversion device having a more effectively disposed capacitor-integrated busbar can be provided.

The invention claimed is:

1. A method of manufacturing a capacitor-integrated busbar including a highly dielectric plate-like resin having a resin material as a base material, and a pair of metal conductors having a facing region where said metal conductors face each other, said facing region being joined to opposing surfaces of said plate-like resin, comprising the step of;

disposing the pair of metal conductors having surfaces facing each other with a gap lying therebetween;

injecting a resin material in a fluid state into the gap between said metal conductors disposed to face each other; and forming the plate-like resin by hardening injected said resin material, wherein the facing region of said pair of metal conductors is provided in advance with fine projections and recesses.

2. The method of manufacturing a capacitor-integrated busbar according to claim 1, wherein the recesses are formed in advance by etching.

3. The method of manufacturing a capacitor-integrated busbar according to claim 2, wherein the recesses are formed to a depth less than a thickness of each of the pair of metal conductors.

* * * * *